(12) United States Patent
Voldman

(10) Patent No.: US 6,455,902 B1
(45) Date of Patent: Sep. 24, 2002

(54) BICMOS ESD CIRCUIT WITH SUBCOLLECTOR/TRENCH-ISOLATED BODY MOSFET FOR MIXED SIGNAL ANALOG/DIGITAL RF APPLICATIONS

(75) Inventor: Steven H. Voldman, South Burlington, VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/731,351

(22) Filed: Dec. 6, 2000

(51) Int. Cl.[7] ............................................. H01L 29/72
(52) U.S. Cl. ...................... 257/378; 257/354; 257/355; 257/357; 257/361
(58) Field of Search ................................. 257/354, 355, 257/357, 378, 361

(56) References Cited

U.S. PATENT DOCUMENTS

| 4,322,767 A | 3/1982 | El Hamamsy et al. |
| 4,739,378 A | 4/1988 | Ferrari et al. |
| 4,989,057 A | 1/1991 | Lu |
| 5,400,202 A | 3/1995 | Metz et al. |
| 5,416,351 A * | 5/1995 | Ito et al. ...................... 257/357 |
| 5,623,156 A | 4/1997 | Watt |
| 5,686,751 A | 11/1997 | Wu |
| 5,760,446 A | 6/1998 | Yang et al. |
| 5,825,067 A | 10/1998 | Takeuchi et al. |
| 5,841,169 A | 11/1998 | Beasom |
| 5,923,068 A | 7/1999 | Lee et al. |
| 6,043,969 A | 3/2000 | Sharpe-Geisler |
| 6,198,135 B1 * | 3/2001 | Sonoda ........................ 257/355 |

* cited by examiner

Primary Examiner—Edward Wojciechowicz
(74) Attorney, Agent, or Firm—Schmeiser, Olsen & Watts; Richard A. Henkler

(57) ABSTRACT

An ESD power clamp circuit provides ESD protection for semiconductor chips through a power clamping device. The power clamping device includes a FET and a bipolar element, formed in an isolation region, and a buried diffusion. The buried diffusion is used as a subcollector for the bipolar element, and is used as an isolation for the FET.

25 Claims, 6 Drawing Sheets

BICMOS ESD CIRCUIT WITH SUBCOLLECTOR/TRENCH-ISOLATED BODY MOSFET FOR MIXED SIGNAL ANALOG/DIGITAL RF APPLICATIONS

BACKGROUND OF THE INVENTION

1. Technical Field

The invention relates generally to semiconductor devices and more specifically to ESD protection for semiconductor devices.

2. Related Art

Electrostatic discharge (ESD), a surge in voltage (negative or positive) that occurs when a large amount of current is applied to an integrated circuit, may cause substantial damage to the circuit. ESD events are particularly troublesome for BiCMOS RF (radio frequency) chips because of their low power requirements and extreme sensitivity. On-chip ESD protection circuits for BiCMOS chips are essential. Generally, though, such circuits require a high failure threshold and a small layout size.

Low loading capacitance and small chips will require ESD protection to assist in the discharge of current through the analog or RF chip. Furthermore, since power domains are separated for noise isolation in mixed signal applications such as RF applications, ESD power clamps are important in providing good ESD protection. To discharge ESD impulses, a ESD protection scheme needs a low voltage turn-on and a high current drive.

Accordingly, a need has developed in the art for a ESD structure that will provide ESD protection in RF or similar applications.

SUMMARY OF THE INVENTION

The present invention provides a ESD power clamp circuit that allows ESD protection for semiconductor chips through a power clamping device. The power clamping device includes a FET and a bipolar element. The power clamping device has a buried diffusion, which is used as a subcollector for the bipolar element, and is used as an isolation for the FET.

Generally, the present invention provides an ESD power clamp circuit comprising:

a trigger circuit;

a delay circuit coupled to said trigger circuit; and a power clamping device, coupled to said delay circuit, said power clamping device including
 an FET formed in an isolated region;
 a bipolar element formed in said isolated region;
 a substrate of a first doping type; and
 a buried diffusion of a second doping type opposite said first doping type, said buried diffusion being a subcollector for said bipolar element, and said buried diffusion being an isolation for said FET.

In addition, the present invention provides a method for protecting a ESD power clamp circuit from electrostatic discharge comprising the steps of:

a) providing a substrate of a first doping type on said chip;

b) providing a buried diffusion of a second doping type;

c) isolating a region of a first doping type from said substrate with said buried diffusion;

d) forming a FET in said isolated region; and e) forming a bipolar element in said isolated region with said buried diffusion being a subcollector for said bipolar element.

The present invention also provides a system having an ESD power clamp circuit comprising:

at least two power rails;

a trigger circuit;

a delay circuit coupled to said trigger circuit; and a power clamping device coupled to said delay circuit, said power clamping device including
 an FET in an isolated region;
 a bipolar element in said isolated region;
 a substrate of a first doping type; and
 a buried diffusion of a second doping type opposite said first doping type, said buried diffusion being a subcollector for said bipolar element, and said buried diffusion being an isolation for said FET.

The foregoing and other features of the invention will be apparent from the following more particular description of embodiments of the invention, as illustrated in the accompanying drawings.

BRIEF DESCRIPTION OF THE DRAWINGS

Embodiments of the present invention will hereinafter be described in conjunction with the appended drawings, where like designations denote like elements, and wherein.

DETAILED DESCRIPTION OF THE DRAWINGS

Figure 1:
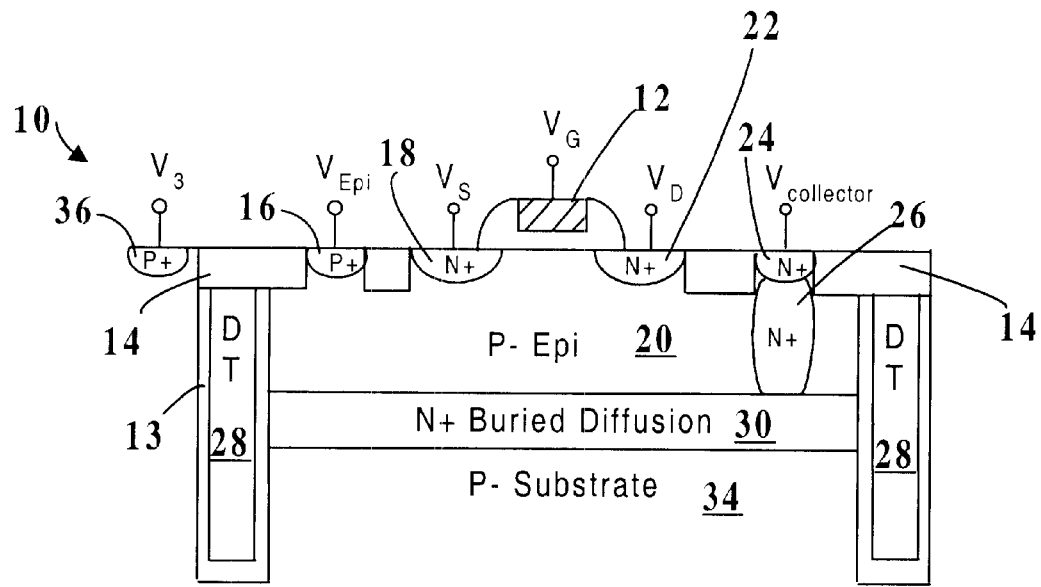
FIG. 1 is a cross-sectional view of a power clamping device in accordance with a first embodiment of the present invention.

FIG. 1 illustrates a cross-sectional view of a power clamping device 10 having a substrate region 34, a buried diffusion region 30, isolated region 20 and deep trench (DT) isolation region 28 in accordance with an embodiment of the present invention.

In this specific example, the substrate region 34 and isolated region 20 (also known as the body) comprises a first doping type (P−). The buried diffusion region 30 comprises a second doping type (N+). The buried diffusion region 30 may be implanted into substrate region 34, or, as in this specific example, may be grown onto an area of the substrate that is opened up by a mask or similar process. Then, an epitaxial region, which becomes isolated region 20, is grown on top of buried diffusion region 30.

Isolated region 20 and buried diffusion region 30 are surrounded by DT isolation region 28, which is made up of polysilicon 28 and DT insulator material 13. DT isolation region 28 is used to reduce the capacitance of buried diffusion region 30, to isolate and electrically decouple power clamping device 10 from other semiconductor devices, and to define isolated region 20.

A first N-type doped contact region 18 is formed in isolated region 20 as the source terminal ($V_S$) of a N-type field-effect transistor (NFET). A second N-type doped contact region 22 is formed in isolated region 20 as the drain terminal ($V_D$) of the NFET. The first and second N-type regions 18 and 22 are spaced apart from each other by a corresponding gate structure 12 with gate terminal ($V_G$). Buried diffusion 30 operates as an isolation for the NFET.

A contact region 16 for an isolated region voltage ($V_{Epi}$), is formed in isolated region 20 by implanting P-type impurities therein. Isolated region voltage ($V_{Epi}$) defines the voltage of the epitaxial layer, and, unless specified, is the same as the voltage of the body ($V_{body}$). An example where $V_{Epi}$ and $V_{body}$ are not the same is discussed in more detail in reference to FIGS. 5 and 6.

A third N-type doped contact region 24 is formed in isolated region 20 as a collector terminal ($V_{collector}$) of a bipolar element. A reach-through N-type region 26 connects contact region 24 with buried diffusion 30. Thus, buried diffusion 30 operates as a subcollector for the bipolar element. For this embodiment, bipolar element is a silicon germanium (SiGe) transistor. Bipolar element may also be a silicon germanium carbon (SiGeC) transistor, but is not limited to such.

Each contact region is spaced apart from adjacent regions by insulators 14. A contact region 36 for a substrate voltage ($V_3$) or any other desired bias or reference voltage is formed in substrate region 34 by implanting P-type impurities therein.

Although specific doping types (e.g., N-type or P-type) are disclosed for specific regions to create an N-type device, it is to be understood that opposite doping types may also be used to create a P-type device, and that the invention is not limited to such. Furthermore, power clamping device 10 may involve use of different technologies, such as standard MOSFET technology, thin-oxide, thick-oxide, STI isolation design, gate dielectric, etc., and is not limited to a specific technology.

Figure 2:
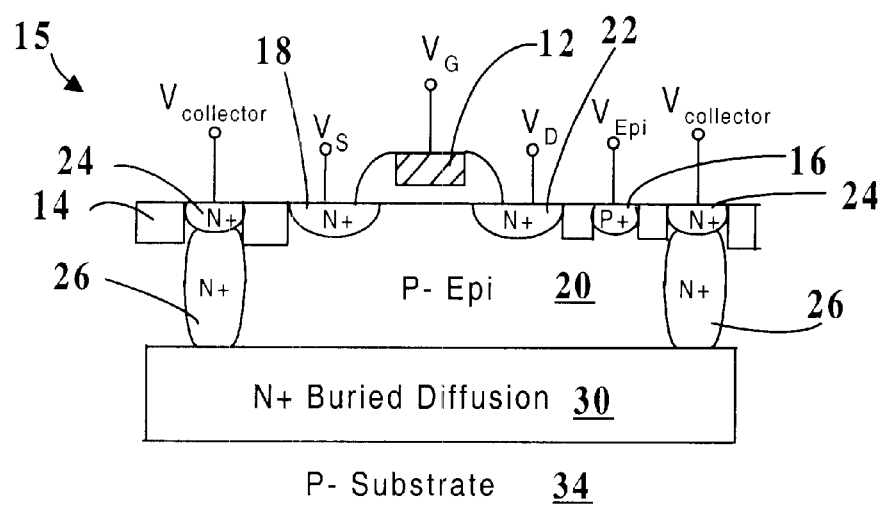
FIG. 2 is a cross-sectional view of a power clamping device in accordance with a second embodiment of the present invention.

As seen in FIG. 2, a cross-sectional view of a power clamping device 15 is shown in accordance with a second embodiment of the present invention. Power clamping device 15 is similar to power clamping device 10 of FIG. 1 (with like numerals designating like regions and structures), except instead of having DT isolation region 28 (FIG. 1) power clamping device 15 uses reach-through region 26 to surround isolated region 20. Thus, reach-through region 26 and buried diffusion 30 isolates the NFET as discussed in reference to FIG. 1.

Figure 3:
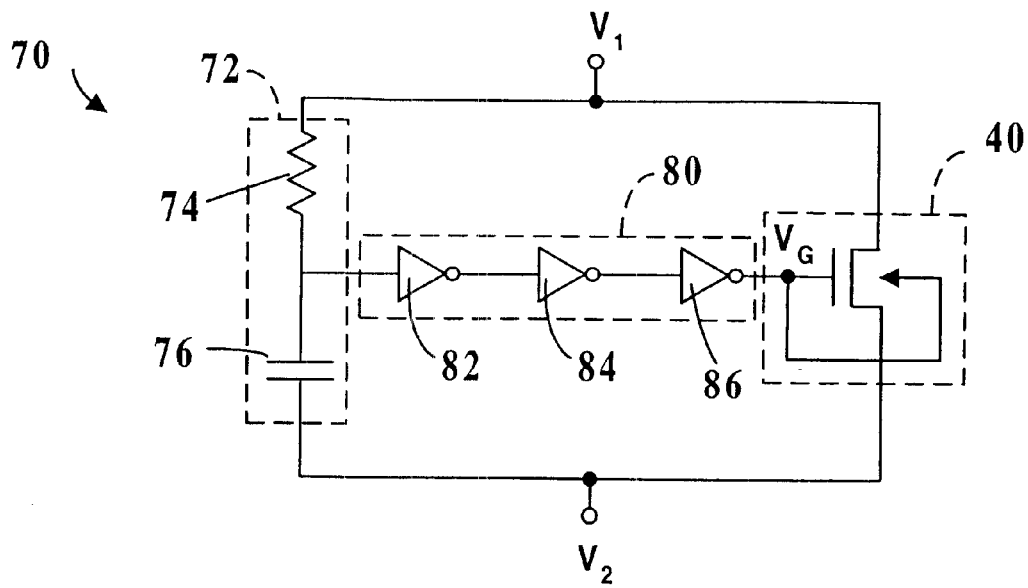
FIG. 3 is schematic circuit diagram of an ESD power clamp circuit including a first example of connections for the device of FIG. 1.

FIG. 3 illustrates a ESD power clamp circuit 70 comprising an RC trigger circuit 72, inverter delay circuit 80 and power clamping device 40. RC trigger circuit 72, which is an RC discriminator, includes resistor 74 in series with capacitor 76 between voltages $V_1$ and $V_2$. Resistor 74 may be, but is not limited to, a SiGe transistor, a SiGeC transistor, a polySiGe resistor, N-diffusion, P-diffusion, MOSFET, wire, diode, etc. Capacitor 76 may be, but is not limited to, an N-capacitor, metal-insulator-metal, FET, FET gate, poly-poly capacitor, etc. Although in this example a resistor and capacitor are specifically used, other trigger circuits may also be used, as will be seen in FIGS. 9–11. Furthermore, although three inverters 82, 84 and 86, are shown in inverter delay circuit 80 in FIG. 3, inverter delay circuit 80 may include more or less inverters, and is not limited to such. Also, the inverter string could be standard FETs or devices that are similar to FIGS. 1 and/or 2, which use the same voltage.

The ESD power clamp circuit in this example and subsequent examples may be used in BiCMOS technology using double or triple power rails (e.g., $V_{EE}$, $V_{SS}$, and $V_{CC}$) For example, if $V_{CC}$=5 Volts (V), $V_{SS}$=0V, and $V_{EE}$=−3V to −5V, EDD power clamp circuit 70 may be implemented between power rails $V_{CC}$ and $V_{SS}$, with $V_1$=$V_{CC}$ and $V_2$=$V_{SS}$. Another example includes $V_3$ (see FIG. 7), wherein $V_1$=$V_{SS}$, $V_2$=$V_{EE}$ and $V_3$=$V_{EE}$, and ESD power clamp circuit 100 is implemented between $V_{SS}$ and $V_{EE}$. Furthermore, two or more ESD power clamp circuits may be stacked between power rails as will be seen in reference to FIG. 12.

Inverter delay circuit 80 is coupled between RC trigger circuit 72 and the gate contact ($V_G$) of power clamping device 40. Power clamping device 40, which connects the gate contact ($V_G$) to its isolated region (or, in this example, its body) 20 is shown and explained in greater detail in FIG. 4. This direct electrical coupling of the body region to the gate contact will be referred to as direct body-coupling. Other body-coupling types, which will be seen and discussed in greater detail in reference to FIGS. 5 and 6, include: capacitive body-coupling, wherein the gate and the body are not directly coupled, and the voltage of the body rises because a capacitance is formed between the drain and body; and charging body-coupling, wherein a current ($I_A$) is formed that forward-biases the body voltage.

Figure 4:
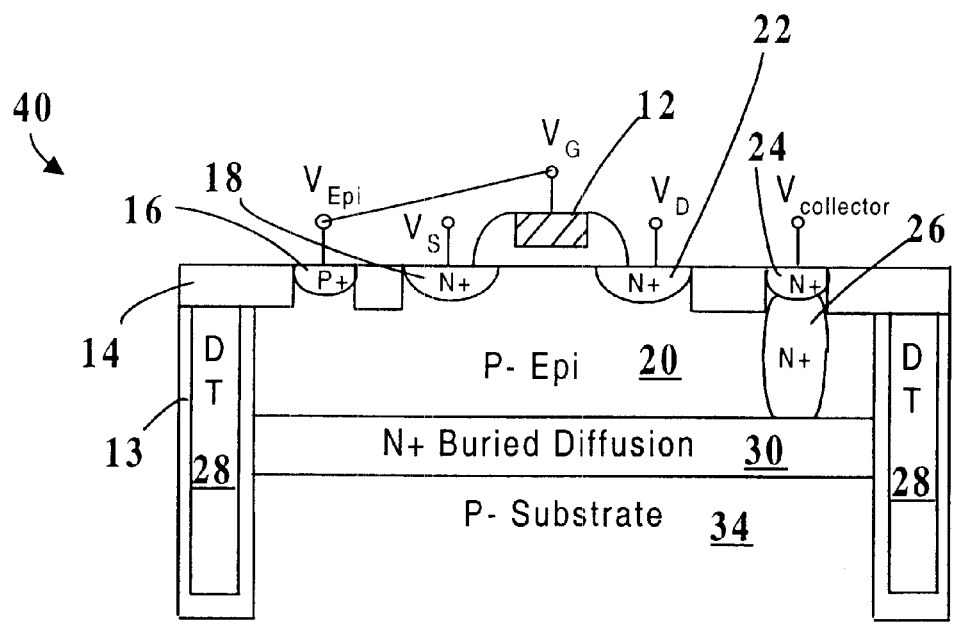
FIG. 4 is a cross-sectional view of FIG. 1 as applied to FIG. 3.

FIG. 4 illustrates the connection of the gate contact 12 to the body which forms the circuit shown in FIG. 3. ESD protection is provided under a turn-on condition of the power clamping device 40. The turn-on condition occurs when the voltage at the gate ($V_G$) exceeds the threshold voltage. That is, as the applied voltage from the inverter delay circuit 80 increases, the body voltage ($V_{body}$) and the gate voltage ($V_G$) will also increase. When the body voltage increases, the threshold voltage decreases. Thus, when the gate voltage exceeds the threshold voltage, current will flow from the drain terminal to the source terminal. This condition is given by the equation:

$$|V_G| > |Vt_{(VEpi-Vbody)}|$$

wherein, $V_G$=gate voltage; and $Vt_{(VEpi-Vbody)}$=the threshold voltage relating to the voltage of the isolated region voltage, which is equal to the body voltage.

Thus, as the body voltage increases, the threshold voltage of power clamping device 40 decreases, creating a dynamic threshold voltage. The power clamping device uses body-coupling to lower the absolute value of the threshold voltage and gate-coupling to turn on the ESD element prior to NFET snapback. Thus, power clamping device 40 has a higher current drive than a device without body-coupling.

Figure 5:
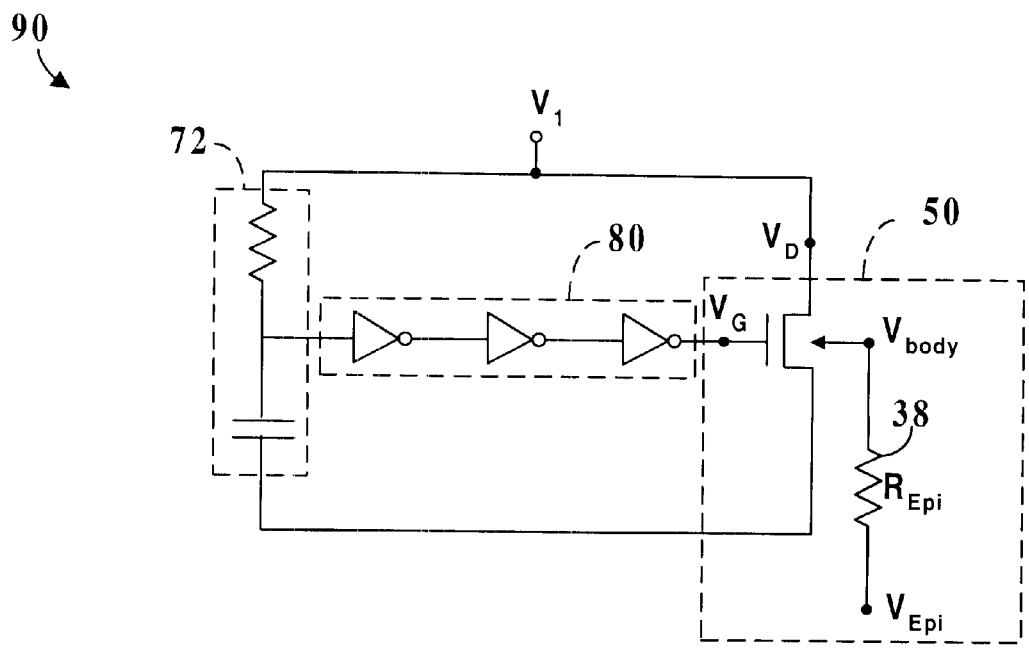
FIG. 5 is schematic circuit diagram of an ESD power clamp circuit including a second example of connections for the device of FIG. 1.

FIG. 5 illustrates a circuit diagram of a ESD power clamp circuit 90 having the RC trigger circuit 72, inverter delay circuit 80 and power clamping device 50. RC trigger circuit 72 and inverter delay circuit 80 are similar to those discussed in reference to FIG. 3. Power clamping device 50 connects its isolated region to $V_{Epi}$, thus creating a body resistance $R_{Epi}$ shown as resistor 38, and a capacitance 42 between the body and the drain. In this example, $V_{Epi}$ is not equal to $V_{body}$. $V_{Epi}$ may be grounded or biased.

Figure 6:
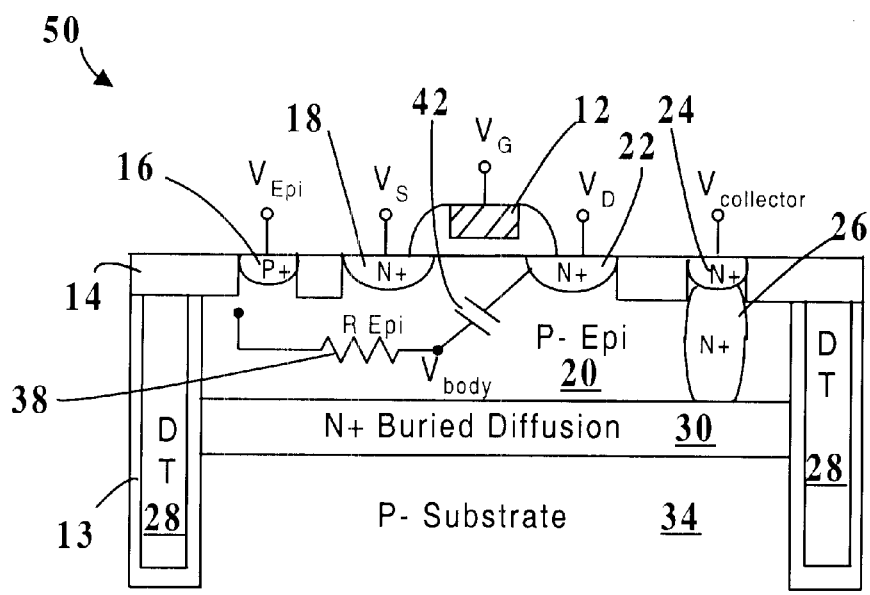
FIG. 6 is a cross-sectional view of FIG. 1 as applied to FIG. 5.

FIG. 6 illustrates the cross-sectional view of power clamping device 50 of FIG. 5 with the connection of isolated region 20 to $V_{Epi}$ and the resistance $R_{Epi}$ that is formed from this connection. In this example, the inverter delay circuit 80 drives the gate since resistance $R_{Epi}$ provides capacitance 42, which decouples the drain and the body. The capacitance 42 causes capacitive body-coupling. When $V_1$ rises from ESD, $V_D$ will rise, causing an avalanche state. This state creates a current ($I_A$). Through this current, in combination with $R_{Epi}$ and $V_{Epi}$, the body voltage $V_{body}$ will rise. This is called charging body-coupling and the condition is given by the equation:

$$V_{body} = I_A * R_{Epi} + V_{Epi}$$

wherein, $V_{body}$=the body voltage;

$I_A$=the avalanche current;

$R_{Epi}$=the resistance of the epitaxial layer; and $V_{Epi}$=the voltage applied to the epitaxial layer.

The body thus rises through both capacitive body-coupling and charging body-coupling and is isolated from driving the gate voltage.

Figure 7:
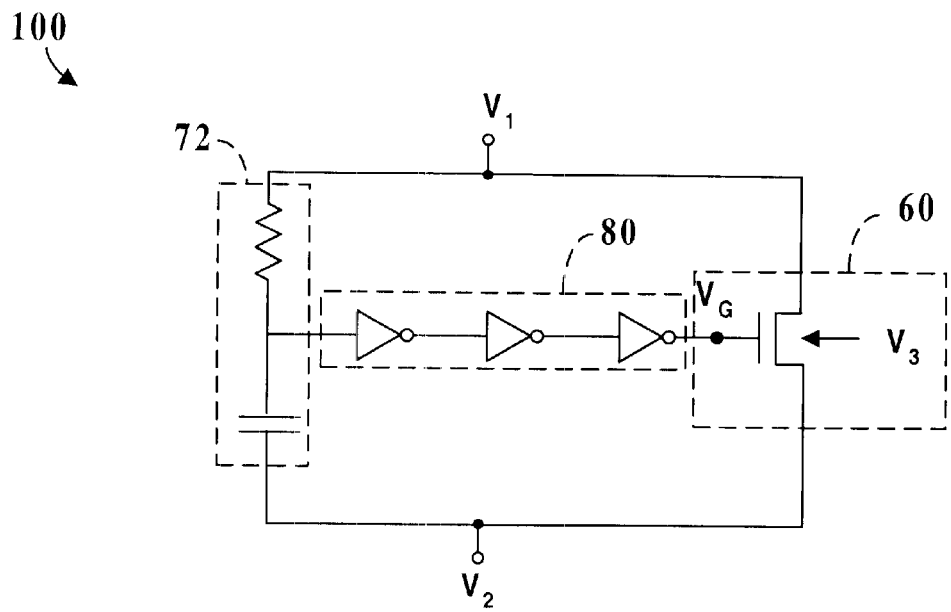
FIG. 7 is schematic circuit diagram of an ESD power clamp circuit including a third example of connections for the device of FIG. 1.

FIG. 7 illustrates a circuit diagram of a ESD power clamp circuit 90 having the RC trigger circuit 72, inverter delay circuit 80 and power clamping device 60. RC trigger circuit 72 and inverter delay circuit 80 are similar to those discussed in reference to FIG. 3. Power clamping device 60 connects its isolated region to a reference voltage ($V_3$), as will be discussed in greater detail in reference to FIG. 8.

Figure 8:
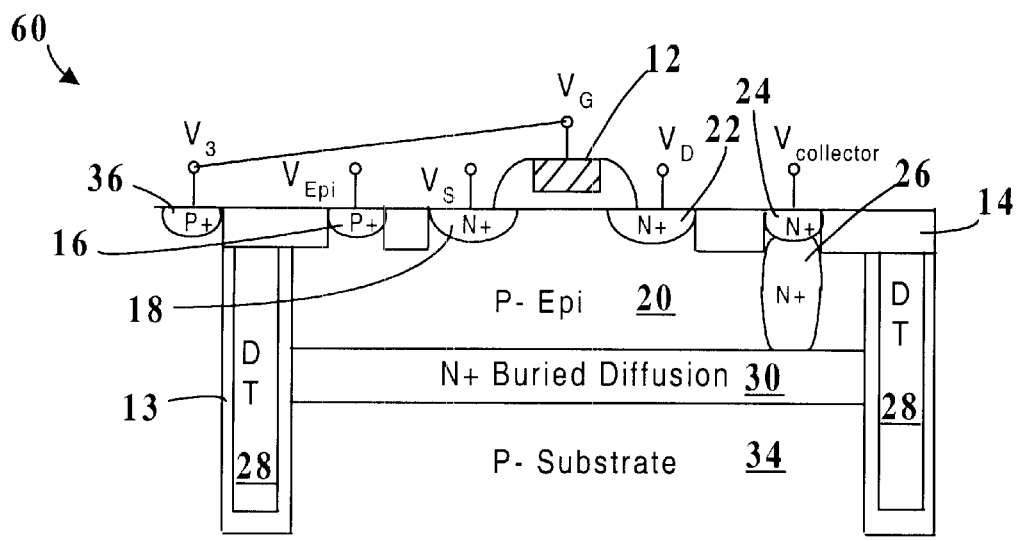
FIG. 8 is a cross-sectional view of FIG. 1 as applied to FIG. 7.

FIG. 8 illustrates the cross-sectional view of power clamping device 60 of FIG. 7 with the connection of isolated region 20 to reference voltage ($V_3$). In this example, power clamping device 60 will activate at a set voltage. Thus, power clamping device 60 may turn off during a control leakage.

Figure 9:
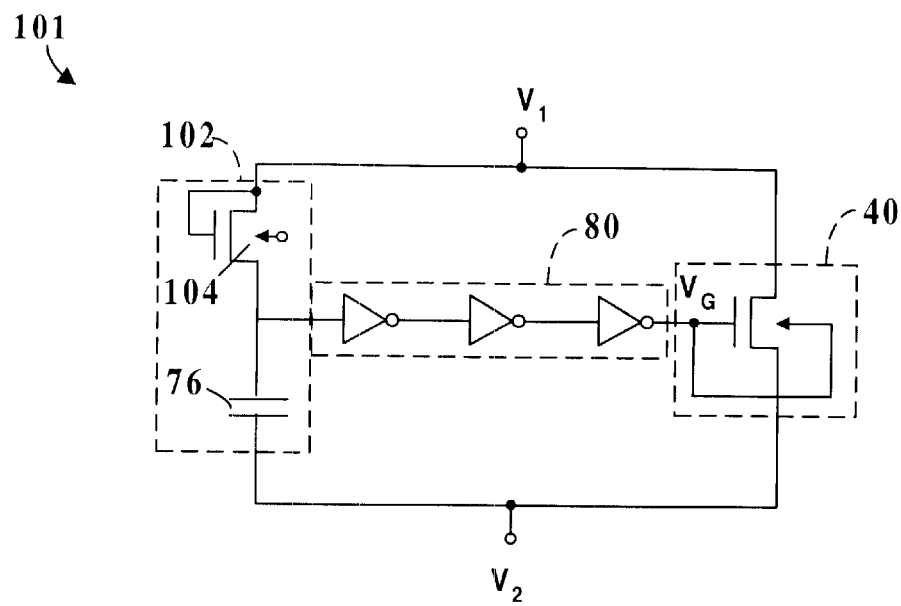
FIGS. 9, 10 and 11 are schematic circuit diagrams of different embodiments of trigger circuits utilizing the power clamping device of FIG. 1.
Figure 10:
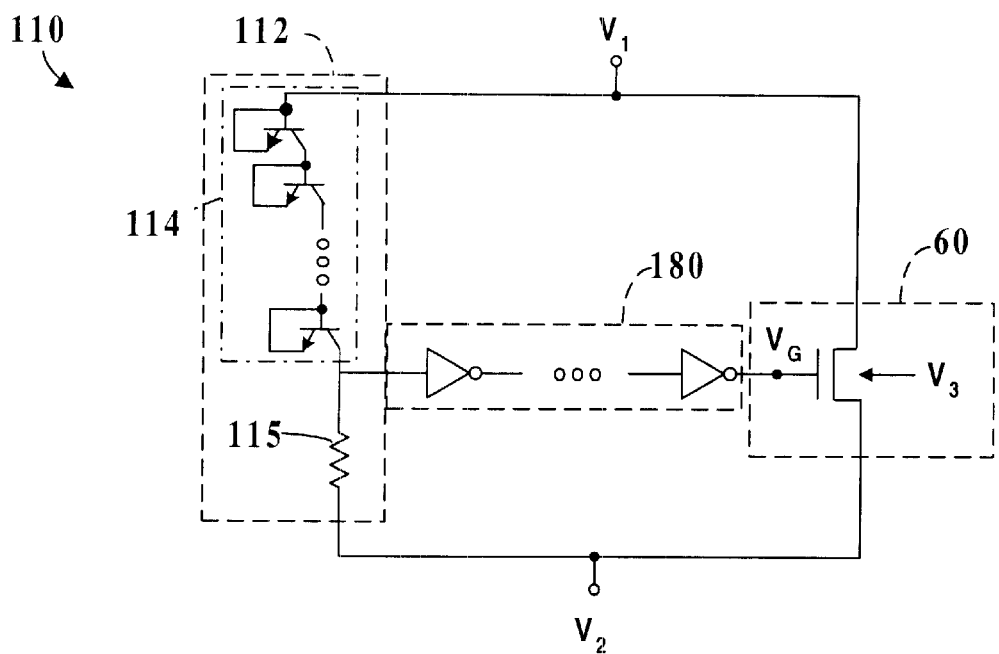
Figure 11:
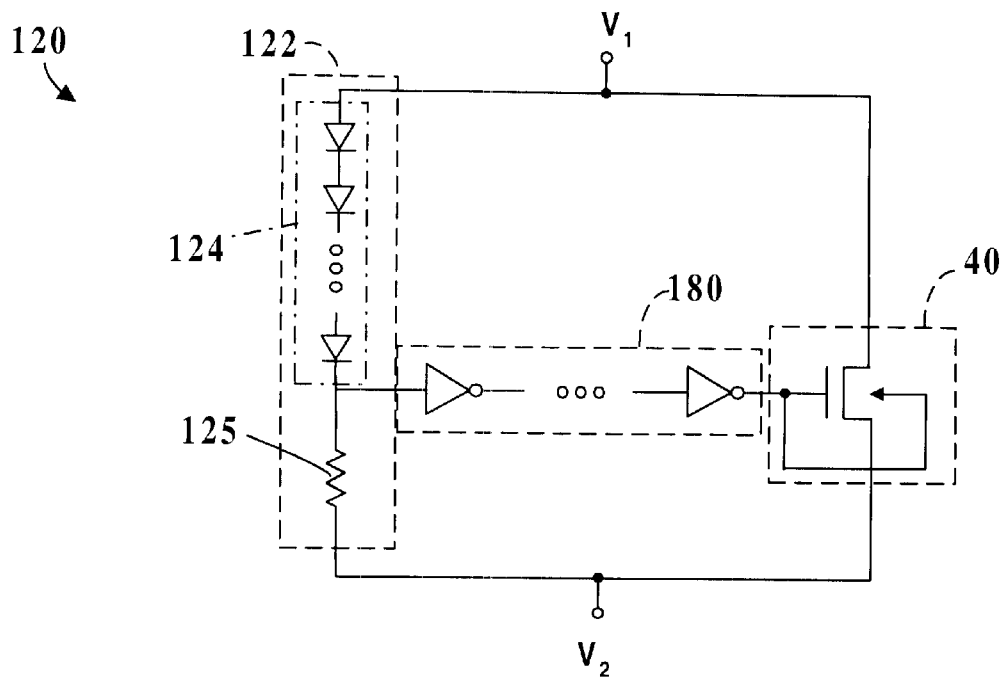

FIGS. 9, 10 and 11 illustrate circuit diagrams of different embodiments of trigger circuits utilizing the power clamping devices 40 (FIG. 4) and 60 (FIG. 6). Both FIGS. 10 and 11 define level shifting networks comprising a series of diode elements, which will be discussed in greater detail below.

FIG. 9 shows a ESD power clamp circuit 101 having an RC trigger circuit 102, inverter delay circuit 80 and power clamping device 40. Inverter delay circuit 80 and power clamping device 40 are similar to those discussed in reference to FIGS. 3 and 4. RC trigger circuit 102, includes capacitor 76 in series with an isolated FET 102 between voltages $V_1$ and $V_2$.

FIG. 10 shows a ESD power clamp circuit 110 having a voltage trigger circuit 112, inverter delay circuit 180 and power clamping device 60. Power clamping device 60 is similar to the device discussed in reference to FIG. 6. Inverter delay circuit 180 shows how more or less than the three inverters in FIG. 3 may be used, and the inverter structure is similar to the structures of the inverters discussed in reference to FIG. 3. The more inverters that are used, the more the RC timing is decoupled from the FET. Furthermore, no inverters may be used if the timing is compatible to the circuit. Voltage trigger circuit 112, includes a series of SiGe npn bipolar devices 114 in series with resistor 115 between voltages $V_1$ and $V_2$. ESD power clamp circuit 110 provides a high current drive and lower threshold voltage for a thick oxide power clamping device 60. Utilizing a thick oxide on power clamping device 60 also protects power clamping device 60 against electrical overstress of the gate dielectric or hot electron sensitivity.

FIG. 11 shows a ESD power clamp circuit 120 having a voltage trigger circuit 122, inverter delay circuit 180 and power clamping device 40. Power clamping device 40 is similar to the device discussed in reference to FIG. 4. Inverter delay circuit 180 is similar to the inverter delay circuit 180 discussed in reference to FIG. 10. Voltage trigger circuit 122, includes a series of SiGe varactor devices 124 in series with resistor 125 between voltages $V_{DD}$ and $V_{SS}$. Although in FIGS. 10 and 11, SIGE varactor devices 124 and SiGe npn bipolar devices 114 are specified, other devices and materials may be used. For example, Schottky diodes, SiGeC npn devices, SiGeC varactors, or SiGe p-i-n diodes.

Figure 12:
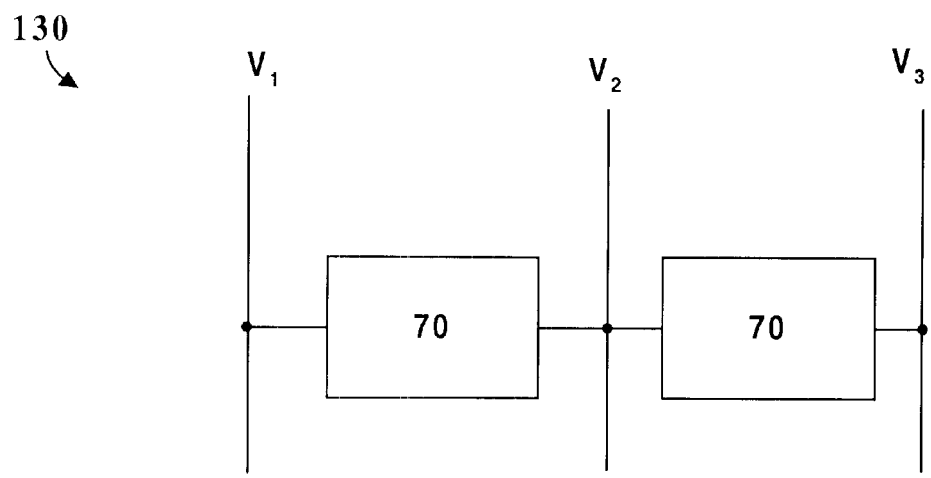
FIG. 12 is a block diagram of a system with the ESD power clamp circuit of FIG. 3.

FIG. 12 illustrates a system 130 having three power rails, $V_1$, $V_2$ and $V_3$ and two ESD power clamp circuits 70 which are stacked and implemented between power rails $V_1$, $V_2$ and $V_3$. As aforementioned, the ESD power clamp circuit in this example may be used in BiCMOS technology using double or triple power rails (e.g., $V_{EE}$, $V_{SS}$, and $V_{CC}$) For this specific example, ESD power clamp circuits 70 are implemented between power rails $V_1$ and $V_2$, and $V_2$ and $V_3$, respectively, with $V_1=V_{CC}$, $V_2 V_{SS}$ and $V_3=V_{EE}$ but is not limited to such, since other power rails, power supplies, or reference voltages may be used in place of these specific power rails. Stacking two or more ESD power clamp circuits provides the system with greater ESD protection.

While the invention has been particularly shown and described with reference to specific embodiments thereof, it will be understood by those skilled in the art that the foregoing and other changes in form and details may be made therein without departing from the spirit and scope of the invention.

What is claimed is:

1. An ESD power clamp circuit comprising:
    a trigger circuit;
    a delay circuit coupled to said trigger circuit; and
    a power clamping device, coupled to said delay circuit, said power clamping device including
        an FET formed in an isolated region;
        a bipolar element formed in said isolated region;
        a substrate of a first doping type; and
        a buried diffusion of a second doping type opposite said first doping type, said buried diffusion being a sub-collector for said bipolar element, and said buried diffusion being an isolation for said FET.

2. The power clamp circuit of claim 1, wherein said isolated region is a region of said first doping type that is isolated by said buried diffusion.

3. The power clamp circuit of claim 1, wherein said buried diffusion is bounded by deep trench isolation.

4. The power clamp circuit of claim 2, wherein said isolated region is bounded by a reach-through structure of said second doping type.

5. The power clamp circuit of claim 2, wherein said isolated region is connected to a bias voltage.

6. The power clamp circuit of claim 2, wherein said FET further comprises:
    a gate, wherein said gate is connected to said delay circuit and said isolated region.

7. The power clamp device of claim 1, wherein said bipolar element is a SiGe transistor.

8. The power clamp circuit of claim 1, wherein said trigger circuit is an RC trigger circuit.

9. The power clamp circuit of claim 1, wherein said trigger circuit is a voltage trigger circuit.

10. The power clamp circuit of claim 9, wherein said voltage trigger circuit comprises:

at least one SiGe varactor element.

11. A method for protecting a ESD power clamp circuit from electrostatic discharge comprising the steps of:

a) providing a substrate of a first doping type on said chip;

b) providing a buried diffusion of a second doping type;

c) isolating a region of a first doping type from said substrate with said buried diffusion;

d) forming a FET in said isolated region;

e) forming a bipolar element in said isolated region with said buried diffusion being a subcollector for said bipolar element;

f) coupling a gate of said FET to a delay circuit; and g) coupling said delay circuit to a trigger circuit.

12. The method of claim 11, further comprising the step of:

f) bounding said buried diffusion by deep trench isolation.

13. The method of claim 11, wherein step c) further comprises the step of:

c1) connecting said isolated region to ground.

14. The method of claim 11, wherein step d) further comprises the steps of:

d1) providing a gate on said FET; and d2) connecting said isolated region to said gate.

15. The method of claim 11, wherein step c) further comprises the step of:

c1) connecting said isolated region to a bias voltage.

16. A system having an ESD power clamp circuit comprising:

at least two power rails;

a trigger circuit;

a delay circuit coupled to said trigger circuit; and a power clamping device coupled to said delay circuit, said power clamping device including an FET in an isolated region;

a bipolar element in said isolated region;

a substrate of a first doping type; and a buried diffusion of a second doping type opposite said first doping type, said buried diffusion being a subcollector for said bipolar element, and said buried diffusion being an isolation for said FET.

17. The system of claim 16, wherein said isolated region is a region of said first doping type that is isolated by said buried diffusion.

18. The system of claim 17, wherein said isolated region is connected to ground.

19. The system of claim 16, wherein said FET further comprises:

a gate, wherein said gate is connected to said isolated region.

20. The system of claim 16, wherein said isolated region further comprises:

a contact, wherein a bias voltage is connected to said contact.

21. The system of claim 16, wherein said power clamping device, said trigger circuit and said delay circuit form an ESD power clamp circuit, and said ESD power clamp circuit is coupled between said at least two of said power rails.

22. The system of claim 21, wherein said ESD power clamp circuit is connected to a second said ESD power clamp circuit through said at least two of said power rails.

23. The power clamp circuit of claim 1, wherein the delay circuit is an invertor delay circuit.

24. The method of claim 11, wherein the delay circuit is an invertor delay circuit.

25. The system of claim 16, wherein the delay circuit is an invertor delay circuit.

* * * * *